United States Patent
Wuu et al.

(10) Patent No.: US 10,311,191 B2
(45) Date of Patent: Jun. 4, 2019

(54) MEMORY INCLUDING SIDE-CAR ARRAYS WITH IRREGULAR SIZED ENTRIES

(71) Applicant: Advanced Micro Devices, Inc., Sunnyvale, CA (US)

(72) Inventors: John J. Wuu, Fort Collins, CO (US); Patrick J. Shyvers, Fort Collins, CO (US); Ryan Alan Selby, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 136 days.

(21) Appl. No.: 15/416,731

(22) Filed: Jan. 26, 2017

(65) Prior Publication Data

US 2018/0210994 A1    Jul. 26, 2018

(51) Int. Cl.
| | |
|---|---|
| *G06F 17/50* | (2006.01) |
| *G11C 7/06* | (2006.01) |
| *G11C 7/20* | (2006.01) |
| *G11C 5/02* | (2006.01) |

(52) U.S. Cl.
CPC ...... *G06F 17/5077* (2013.01); *G06F 17/5072* (2013.01); *G06F 17/5081* (2013.01); *G11C 7/06* (2013.01); *G11C 7/20* (2013.01); *G11C 5/025* (2013.01)

(58) Field of Classification Search
USPC .................. 716/118, 119, 126, 130
See application file for complete search history.

(56) References Cited

U.S. PATENT DOCUMENTS

| | | |
|---|---|---|
| 4,044,338 A | 8/1977 | Wolf |
| 4,453,212 A | 6/1984 | Gaither et al. |
| 4,807,115 A | 2/1989 | Torng |
| 4,858,105 A | 8/1989 | Kuriyama et al. |
| 5,226,126 A | 7/1993 | Favor et al. |
| 5,226,130 A | 7/1993 | McFarland et al. |

(Continued)

FOREIGN PATENT DOCUMENTS

| | | |
|---|---|---|
| EP | 0259095 A2 | 3/1988 |
| EP | 0381471 A2 | 8/1990 |

(Continued)

OTHER PUBLICATIONS

Thomas et al., U.S. Appl. No. 09/376,730, entitled "Selectively Delaying Clock Signal Arrival at Elements in a Circuit Design", filed Aug. 17, 1999, 34 pages.

*Primary Examiner* — Brian Ngo
(74) *Attorney, Agent, or Firm* — Meyertons Hood Kivlin Kowert and Goetzel PC; Rory D. Rankin

(57) ABSTRACT

A system and method for floorplanning a memory. A computing system includes a processing unit which generates memory access requests and a memory. The size of each memory line in the memory includes M bits. A memory macro block includes at least a primary array and a sidecar array. The primary array stores a first portion of a memory line and the sidecar array stores a second smaller portion of the memory line being accessed. The primary array and the sidecar array have different heights. The height of the sidecar array is based on a notch height in at least one corner of the memory macro block. The notch creates on-die space for s reserved area on the die. The notches result in cross-shaped, T-shaped, and/or L-shaped memory macro blocks.

20 Claims, 11 Drawing Sheets

(56) References Cited

U.S. PATENT DOCUMENTS

| | | | |
|---|---|---|---|
| 5,261,066 A | 11/1993 | Jouppi | |
| 5,317,718 A | 5/1994 | Jouppi | |
| 5,388,224 A | 2/1995 | Maskas | |
| 5,414,745 A | 5/1995 | Lowe | |
| 5,526,510 A | 6/1996 | Akkary | |
| 5,530,958 A | 6/1996 | Agarwal | |
| 5,600,839 A | 2/1997 | MacDonald | |
| 5,625,807 A | 4/1997 | Lee et al. | |
| 5,892,373 A | 4/1999 | Tupuri et al. | |
| 5,900,012 A | 5/1999 | Tran | |
| 6,452,851 B1 * | 9/2002 | Endo | G11C 5/025 365/154 |
| 6,624,681 B1 | 9/2003 | Loyer et al. | |
| 6,782,486 B1 | 8/2004 | Miranda et al. | |
| 6,832,327 B1 | 12/2004 | Magro et al. | |
| 7,861,192 B2 | 12/2010 | Chejara | |
| 2002/0154562 A1 * | 10/2002 | Endo | G11C 7/065 365/205 |
| 2003/0174564 A1 * | 9/2003 | Higuchi | G11C 5/025 365/200 |
| 2004/0093456 A1 * | 5/2004 | Terada | G11C 5/025 711/1 |
| 2007/0047365 A1 * | 3/2007 | Yoshinaga | G11C 5/147 365/226 |
| 2007/0156995 A1 | 7/2007 | Kaburlasos | |
| 2015/0364168 A1 | 12/2015 | Riley et al. | |

FOREIGN PATENT DOCUMENTS

| | | |
|---|---|---|
| EP | 0459232 A2 | 12/1991 |
| EP | 0644475 A2 | 3/1995 |
| GB | 2263985 A | 8/1993 |
| GB | 2263987 A | 8/1993 |
| GB | 2281422 A | 8/1993 |

* cited by examiner

*Memory Floorplan 800*

| M = number of macro cells on output bus = 128 | D = largest power-of-2 value ≤ the quotient (M-A-B) / A = (128 - 6 - 24) / 16 = 88/16 = 5.5 -> 4 |
|---|---|
| N = number of entries in primary bank = 16 | |
| A = number of macro cells removed from output bus in primary bank = 16 | N / D = number of entries in sidecar bank = 16 / 4 = 4 |
| (M − A) = number of macro cells on output bus for primary bank = (128 − 16) = 112 | S1 = amount of bit separation in the primary bank for output bus = 1 |
| B = number of macro cells used to provide notches (12 cell at top, 12 cell at bottom) = 24 | S2 = amount of bit separation in the sidecar bank for output bus = D x S1 = 4 x 1 = 4 |

*FIG. 9*

MEMORY INCLUDING SIDE-CAR ARRAYS WITH IRREGULAR SIZED ENTRIES

BACKGROUND

Description of the Relevant Art

Generally speaking, a semiconductor chip includes at least one processing unit coupled to a memory. The processing unit processes instructions of a predetermined algorithm by performing calculations and generating memory access requests. The processing unit accesses the memory for fetching instructions and operands and for storing results. In some embodiments, the processing unit and the memory are on a same die. In other embodiments, the processing unit and the memory are on different dies within a same package such as a system-on-a-chip (SOC). Other components, such as an interface unit, are also on the die or the package.

The memory, the at least one processing unit, and other components are placed on the same die or the same package according to a floorplan. The floorplan is a graphical representation of the partitioning of the die or package area. In various embodiments, the partitioning uses shapes, such as rectangles, to represent the placement of the memory, the at least one processing unit and other components. The memory, the at least one processing unit, and other components are often referred to as macro blocks. The shapes used for the floorplan have dimensions of the macro blocks they represent.

The dimensions of the shapes have limits in order to place all of the components on the same die or the same package. The limits are set by various factors such as area for bonding pads, input/output (I/O) line drivers for signals corresponding to the bonding pads, timing constraints of the macro blocks, predefined rectangles for the at least one processing unit and other intellectual property blocks (IP blocks), and reserved areas. Some examples of reserved areas are areas for routing and buffering clock signals, as well as data and control signals across the die or package.

An additional example of the reserved areas are areas used for the combination of through silicon vias (TSVs) and their corresponding keep out zones. Further, in various embodiments, the dimensions of the TSV and the corresponding keep out zone are significantly smaller than the minimum TSV pitch. Therefore, the resulting channel consumes a significant amount of empty space on the die or package.

The above limits for the dimensions of the floorplan rectangles put constraints on the macro blocks being designed. For several types of memory macro blocks, the rectangular dimensions exceed limits for efficient placement. In some cases, the size and dimensions of the macroblocks are such that significant redesign is required so that other necessary components will fit on the same die or within the same package. In addition, altering the dimensions of the memory is further made difficult as the row or entry decoding is typically dependent on a $2^n$ value where n is an integer. In various embodiments, this value sets one dimension, such as the width, while the dimensions of an individual memory cell set the height. In addition, dimensions are also based in part on the bit separation or interleaving used to defend against soft errors.

In view of the above, efficient methods and systems for efficiently floor planning a memory are desired.

BRIEF DESCRIPTION OF THE DRAWINGS

FIG. 9 is a generalized block diagram of a table of equations for an embodiment of a memory floorplan.

Figure 1:
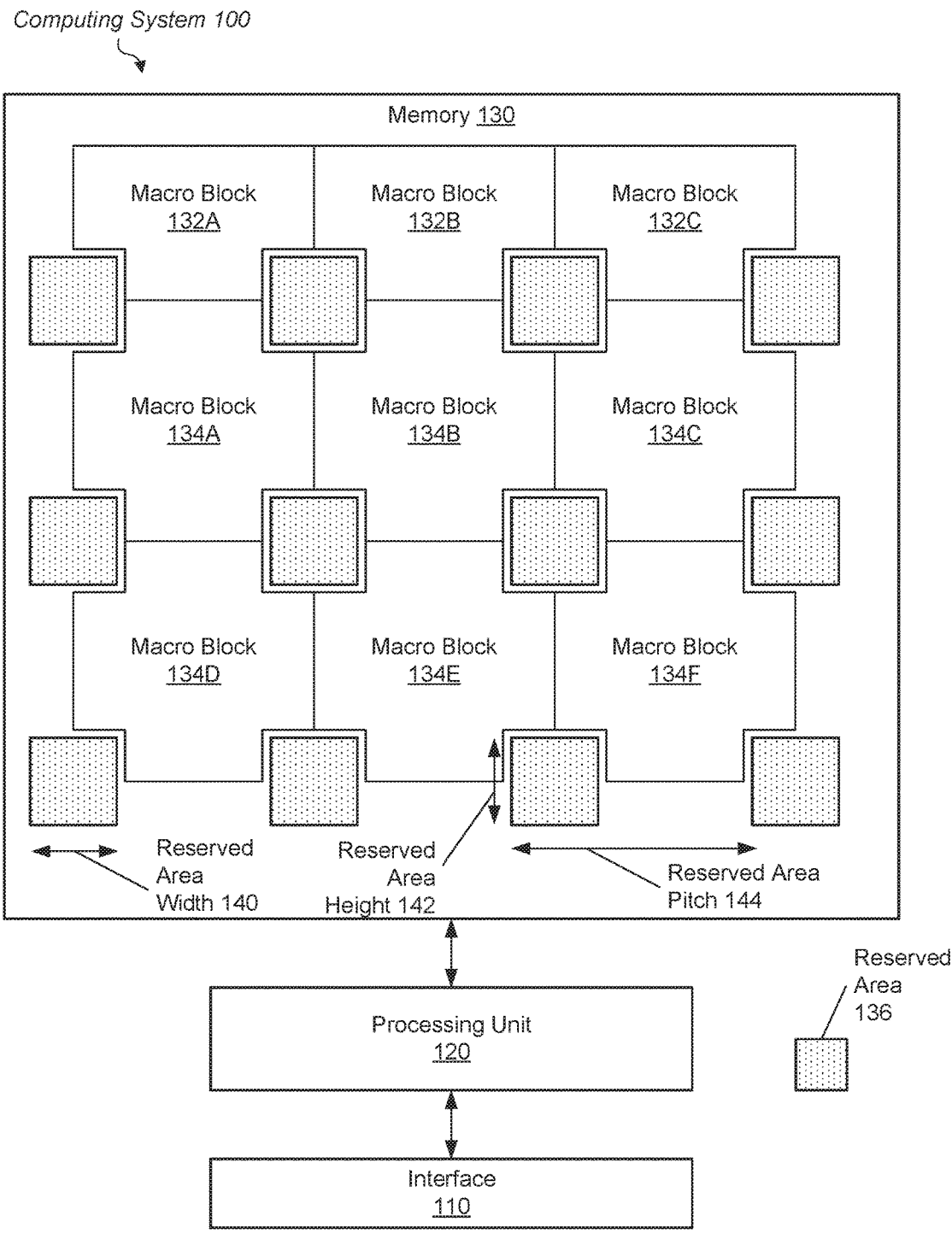
FIG. 1 is a generalized block diagram of one embodiment of a computing system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION OF EMBODIMENT(S)

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Systems and methods for efficiently floor planning a memory are contemplated. In various embodiments, a computing system includes a processing unit, a memory and control logic. In some embodiments, the processing unit and the memory are on a same die. In other embodiments, the processing unit and the memory are on different dies within a same package such as a system-on-a-chip (SOC). In various embodiments, each of the memory, processing unit and other components utilizes one or more macro blocks.

Each of the macro blocks are placed on the same die or the same package according to a floorplan. The floorplan of the die and/or package determines the placement of macro blocks, input/output pads, signal routes, power grids, ground grids and reserved areas in the die or package area. The reserved areas are areas for routing and buffering clock signals as well as data and control signals across the die or package.

An additional example of the reserved areas are areas used for the combination of through silicon vias (TSVs) and their corresponding keep out zones.

The width, height and pitch of some examples of the reserved area create inefficient area usage. Rather than create wide channels opened between rectangular memory macro blocks to create space for the reserved areas, memory macro blocks with alternative shapes are used. For example, in various embodiments, one or more of cross-shaped, T-shaped or L-shaped memory macro blocks are used in place of rectangular memory macro blocks. The reserved areas are placed in spaces created by the notches in the corners of adjoining memory macro blocks. No wide channels are used as they are unnecessary. Previous empty spaces due to wide channels are filled by additional memory cells, thus increasing area efficiency and reducing die and/or package size.

The memory macro blocks with alternative shapes use a primary array and a sidecar array to store a complete memory line. In various embodiments, each of the primary array and the sidecar array stores respective portions of memory lines. The first portion of the memory line stored in the primary array is larger than the second portion of the memory line stored in the sidecar array. Each of the primary array and the sidecar array has a separate, different height. The size and placement of the sidecar array creates one of the alternative macro block shapes such as the cross shape, the T shape and the L shape. The height of the primary array is less than a height that would be used if the primary array included all of the bits in each memory line and no sidecar array was used.

The height of the primary array is based on the pitch of the reserved areas, which determines how much to reduce the height of the primary array that would be used if the primary array included all of the bits in each memory line and no sidecar array was used. The height and placement of the sidecar array is based on the dimensions of the reserved areas which creates the notches in the corners of adjoining memory macro blocks. If notches are created in all four corners of the memory macro block, then a cross-shaped memory macro block is used. If notches are created in only the top or bottom corners of the memory macro block, then a T-shaped memory macro block is used. If a notch is created in a single corner of the memory macro block, then an L-shaped memory macro block is used.

In various embodiments, the sidecar array has a number of entries equal to the number of entries in the primary array divided by the integer D. The integer D is the largest power-of-2 value which is less than or equal to the ratio of (M−A−B)/A. In the ratio, each memory line in the memory stores M bits, the second portion of the memory line stored in the sidecar array includes A bits of the M bits, and a height of the reserved area defining the notches in the corners of the memory macro blocks is the height of B bits. The number of entries in the primary array is N, and the number of entries in the sidecar array is N/D. Each of M, N, A, B and D is an integer greater than zero.

In one example, the memory line stores 128 bits (M=128), the primary array uses 16 entries (N=16) and 16 bits are moved from the primary array to the sidecar array to reduce the height of the primary array based on at least the reserved area pitch. Therefore, A=16. In addition, the reserved area has a height of 24 memory bit cells. In this example, the memory macro block will be a cross-shaped memory macro block and each notch in each corner has a height of 12 memory bit cells so that a notch at the top left has a height of 12 bit cells and a notch at the bottom left has a height of 12 bit cells for a total of 24 bit cells. The heights are the same on the right side of the memory macro block. Thus, B=24. The quotient (M−A−B)/A provides the result (128−16−24)/16=5.50. The largest power-of-2 value less than or equal to 5.5 is the integer 4. The sidecar array uses N/D entries, or 16/4=4 entries.

The memory macro block does not use a rectangle-shaped macro block with 16 entries arranged in a vertical orientation with a height of a memory line of 128 bit cells. In other embodiments, a horizontal orientation is used for storage of the memory lines. Rather, in this example, the memory macro block uses a cross-shaped macro block. The right half of the macro block has a primary array with 16 entries arranged in a vertical orientation with a height of 128−16=112 bit cells. The left half is arranged in a similar manner as the right half. The right half as well as the left half also has a sidecar array with 4 entries arranged in a vertical orientation with a height of 112−12 (top)−12 (bottom)=88 bit cells. The height of 88 bit cells for the sidecar array provides a top corner notch height of 12 bit cells and a bottom corner notch height of 12 bit cells.

The bottom of the sidecar array aligns with the top of the $12^{th}$ bit cell from the bottom of the primary array. The top of the sidecar array aligns with the top of the $100^{th}$ bit cell from the bottom of the primary array. The new top of the primary array is the top of the $112^{th}$ bit cell from the bottom of the primary array. The $113^{th}$ bit cell to the $128^{th}$ bit cell of a given memory line is stored in the sidecar array, rather than the primary array. Although it is possible and contemplated that other 16-bit portions of the memory line are removed from the primary array to the sidecar array. When a memory line is accessed by a request from the processing unit, the control logic accesses 112 bits of the memory line from the primary array and accesses 16 bits of the memory line from the sidecar array. In addition, the completion of the access request for all M, or 74, bits of the memory line is done at a similar time, such as a same clock cycle. The completion of the access request is not staggered for the primary array and the sidecar array. These and other embodiments will be further appreciated upon reference to the following description and drawings.

Referring to FIG. 1, a generalized block diagram of one embodiment of a computing system 100 is shown. As shown, the computing system 100 includes a processing unit 120, a memory 130, and an interface 110. The memory 130 is shown to use T-shaped macro blocks 132A-132C and cross-shaped macro blocks 134A-134F placed around the reserved areas 136. It will be appreciated that for simplicity and clarity of illustration, elements shown in the figures have not necessarily been drawn to scale. For example, the dimensions of some of the elements are exaggerated relative to other elements.

In some embodiments, the functionality of the computing system 100 is included as components on a single die, such as a single integrated circuit. In other embodiments, the functionality of the computing system 100 is included as multiple dies on a system-on-a-chip (SOC). The computing system is used in a desktop, a portable computer, a mobile device, a server, a peripheral device, or otherwise. In various embodiments, the interface 110 includes interface control logic for communicating with devices and units located externally to the computing system 100. The control logic in the interface 110 operates according to communication protocols corresponding to external units. The interface 110 includes buffers for storing both internally and externally generated requests and results.

The processing unit 120 processes instructions of a predetermined algorithm. The processing includes fetching instructions and data, decoding instructions, executing instructions and storing results. The processing unit 120 is one of a general-purpose microprocessor, an application specific integrated circuit (ASIC), a single-instruction-multiple-data (SIMD) microarchitecture processor, and so forth. While executing instructions, the processing unit 120 performs calculations and generate memory access requests.

The memory 130 is accessed for both the fetching operations and the generated memory access requests, which include storing results. In some embodiments, the memory 130 is a cache hierarchy memory subsystem. In other embodiments, the memory 130 is a random access memory (RAM). In yet other embodiments, the memory 130 is a set of one or more buffers. In still yet other embodiments, the memory 130 is a field programmable gate array (FPGA). Although a single memory is shown, in various embodiments, multiple memories are used in the computing system 100. In some embodiments, the memory 130 is a complete memory. In other embodiments, the memory 130 is a portion of a memory subsystem. In various embodiments, the memory 130 has a layout dimension size, such as a height or a width, which is sufficiently great as to interfere with the placement of the components in the computing system 100. In addition, in some embodiments, the layout dimension size of the memory 130 interferes with the placement of reserved areas 136.

In various embodiments, the reserved areas are on-die areas used for routing and buffering clock signals as well as data and control signals across the die or package. In addition, in some embodiments, the reserved areas are areas used for the combination of through silicon vias (TSVs) and their corresponding keep out zones. The TSVs are used as a vertical electrical connection traversing through a silicon wafer. The TSVs are used to create three-dimensional integrated circuits (3D ICs). The 3D ICs are circuits with two or more layers of active electronic components integrated both vertically and horizontally into a single circuit. The TSVs are an alternative interconnect to wire-bond and flip chips.

A corresponding keep out zone for a TSV defines an area around the TSV providing a predicted stress caused by the placement of the TSV to an active device to be above a threshold. Areas outside of the keep out zone provide a predicted stress caused by the placement of the TSV to an active device to be below the threshold. For memory arrays in 3D ICs, in various embodiments, the TSVs and the corresponding keep out zones create inefficient on-die area usage, as wide channels are opened between rectangular memory macro blocks for placement of the TSVs and the corresponding keep out zones.

As shown, the reserved areas 136 in the memory 130 have a width 140, a height 142 and a pitch 144 used for placement in the floorplan. Although a single type of reserved area 136 is shown within the memory 130, other types of reserved areas with respective dimensions and pitch are also possible and contemplated. In various embodiments, each of the interface 110, the processing unit 120 and the memory 130 uses macro blocks. Each macro block includes circuitry for one or more of datapath functions, control logic such as state machines, data storage and input/output signals used to communicate with other macro blocks. In some embodiments, the circuitry within the macro blocks uses predetermined standard cells among custom design. In various embodiments, each of the T-shaped macro blocks 132A-132C and cross-shaped macro blocks 134A-134F uses one or more arrays of memory bit cells and circuitry for implementing sense amplifiers, row decoders and word line drivers. As used herein, macro blocks are also referred to as macros.

In some embodiments, the other components in the computing system 100 do not fit within the same die or the same package due to the height or the width of the memory 130. Alternatively, the other components fit within the same die or the same package but the placement of the components creates unused space.

The pitch used for components other than the reserved areas in the computing system 100 refer to a minimum allowable distance between two entities. Different pitches are used for different entities. In some embodiments, the entities are transistor gates, two metal lines on a particular metal layer in a fabrication process, macro blocks and so on. The pitch-matching between two components in the computing system 100 allows connection of the two components by abutment and no extra on-die real estate is used for wire routes (metal lines) between the two components. In addition, the power supply and ground reference lines have fixed locations for the pitch-matched components. Further, each of the pitch-matched components, such as macro blocks, have a fixed height or a fixed width. For the components to be pitch-matched to the die or package, the macro blocks located on the die at a distance that is an integer multiple of a pitch match measured from a given corner of the die, such as the bottom left corner of the die.

Further, the placement of the reserved areas in the computing system 100, such as the reserved areas 136 in the memory 130, cause memory macro blocks to be spaced apart to create wide channels for the reserved areas 136. Thus, without modification of rectangular memory macro blocks, the dimensions of the memory 130 increase and interfere with the floorplan placement of other components. The floorplan placement of the components is either inefficient or renders the chip inoperable. In various embodiments, altering the dimensions of the memory 130 is difficult as the row or entry decoding is dependent on a power-of-2 value. This value sets one dimension of the memory 130, such as the width. The dimensions of an individual memory bit cell sets the other dimension, such as the height. In addition, this other dimension is set by the bit separation or interleaving used to defend against soft errors. In this example, the height is too tall for efficient placement of the components. The dimensions of the individual memory cell and the bit separation are parameters that have already been reduced as much as possible while satisfying design requirements. Further, the reserved areas 136 create wide channels of unused space when rectangular memory macro blocks are used within the memory 130.

As shown, in place of using rectangular memory macro blocks, the memory 130 uses T-shaped macro blocks 132A-132C and cross-shaped macro blocks 134A-134F. The reserved areas 136 are placed in the spaces created by the corner notches of the T-shaped macro blocks 132A-132C and cross-shaped macro blocks 134A-134F. No wide channels are used as they are unnecessary. Previous empty spaces due to wide channels are filled by additional memory cells, thus increasing area efficiency and reducing die and/or package size.

Figure 2:
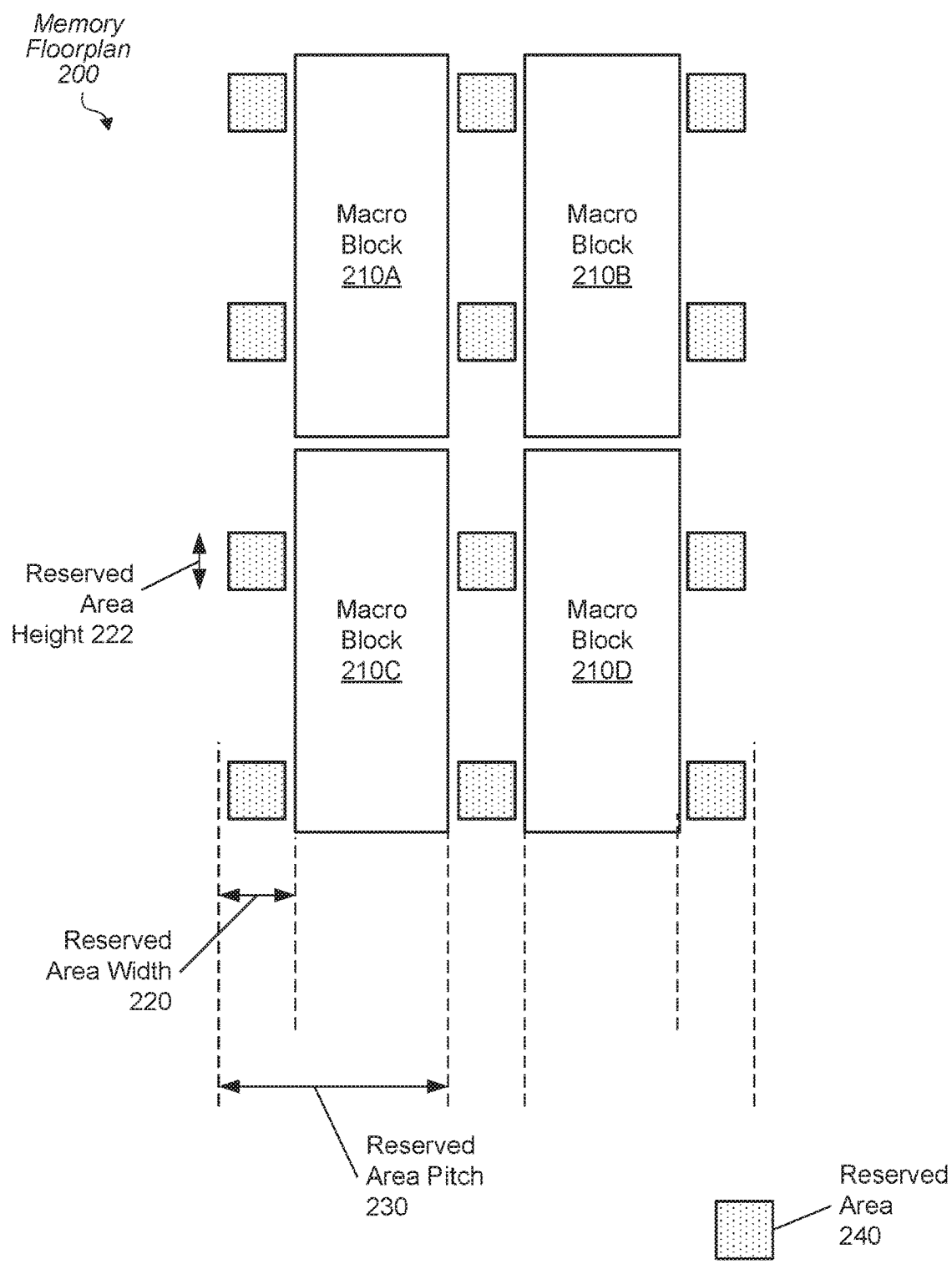
FIG. 2 is a generalized block diagram of one embodiment of a memory floorplan.

Referring to FIG. 2, a generalized block diagram of one embodiment of a memory floorplan 200 is shown. The memory floorplan 200 uses rectangular-shaped memory macro blocks 210A-210D. As described earlier, in various embodiments, memory macro blocks use one or more arrays of memory bit cells and circuitry for implementing sense amplifiers, row decoders and word line drivers. The memory floorplan 200 also includes the reserved areas 240. The reserved areas 240 have a width 220, a height 222 and a pitch 230 used for placement in the floorplan 200.

As described earlier, the reserved areas 240 are on-die areas used for the placement of repeaters for routing and buffering clock signals as well as data and control signals across the die or package. The reserved areas 240 can also include areas used for placement of through silicon vias (TSVs) and their corresponding keep out zones. Although a single set of dimensions are shown for the reserved area 240, other dimensions for varying types of reserved areas are also possible and contemplated. As the memory macro blocks 210A-210D use a rectangular shape, channels are opened between the memory macro blocks 210A-210D to create space for the reserved areas 240. The empty spaces in the channels are not filled with memory cells or other circuitry. Therefore, an appreciable amount of unused on-die space is created.

Figure 3:
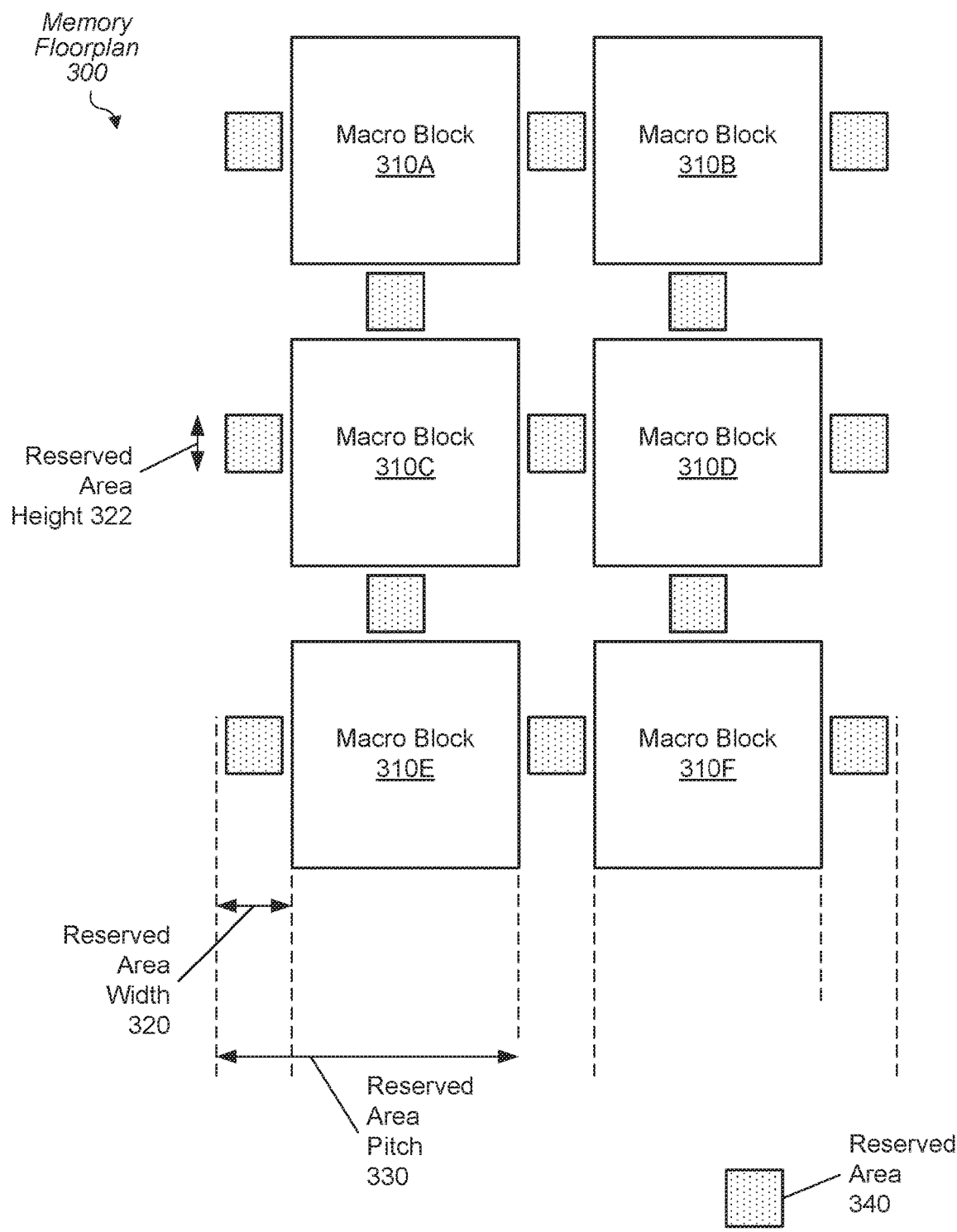
FIG. 3 is a generalized block diagram of another embodiment of a memory floorplan.

Turning now to FIG. 3, a generalized block diagram of another embodiment of a memory floorplan 300 is shown. The memory floorplan 300 uses square-shaped memory macro blocks 310A-310F. The memory floorplan 300 also includes the reserved areas 340. The reserved areas 340 have a width 320, a height 322 and a pitch 330 used for placement in the floorplan 300. In various embodiments, the memory floorplan 300 has a higher memory array density than the earlier memory floorplan 200. However, channels are still opened between the memory macro blocks 310A-310F to create space for the reserved areas 340. The empty spaces in the channels are not filled with memory cells or other circuitry. Therefore, an appreciable amount of unused on-die space is created.

Figure 4:
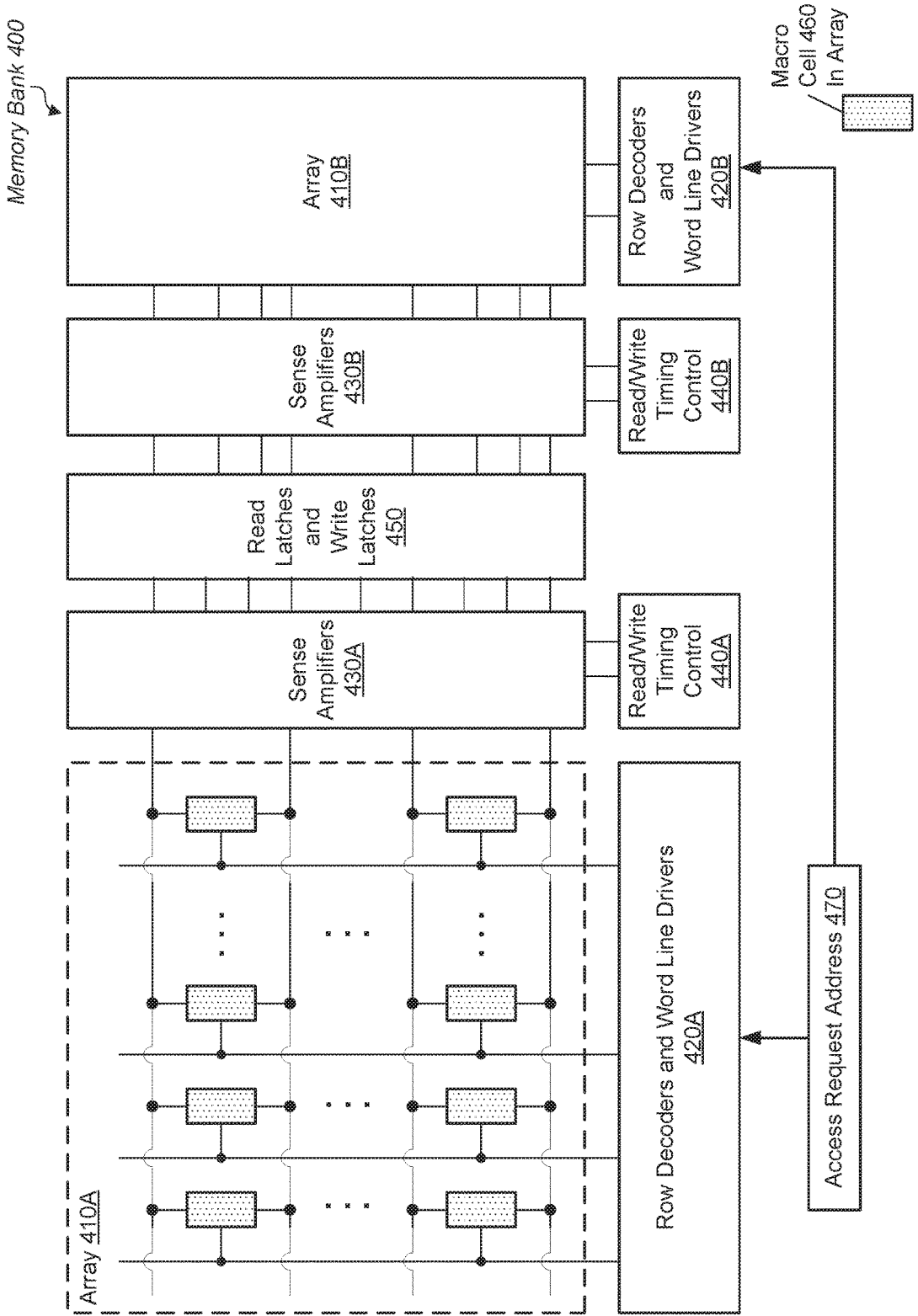
FIG. 4 is a generalized block diagram of another embodiment of a memory bank.

Turning now to FIG. 4, a generalized block diagram of one embodiment of a memory bank 400 is shown. In various embodiments, a memory macro block includes both a left bank and a right bank. The bank 400 is a left bank or a right bank of a memory macro block. As the memory bank 400 does not include a primary array in addition to a sidecar array, the memory bank 400 is used for a rectangular-shaped or square-shaped memory macro block. Primary arrays, sidecar arrays and alternately shaped memory macro blocks are further described shortly. However, many of the components in the memory bank 400 are also used in the alternately shaped memory macro blocks such as the cross-shaped, T-shaped and L-shaped macro blocks. As shown, the bank 400 includes arrays 410A-410B, row decoders 420A-420B, sense amplifiers 430A-430B between the arrays 410A-410B, read and write timing control logic 440A-440B, and read latches and write latches in block 450.

In various embodiments, each of the blocks 410A-410B, 420A-420B, 430A-430B, 440A-440B and 450 in the memory bank 400 is communicatively coupled to another one of the blocks. For example, direct connections are used wherein routing occurs through another block. Alternatively, staging of signals is done in an intermediate block. In various embodiments, each of the arrays 410A-410B includes multiple memory bit cells 460 arranged in a tiled format. In various embodiments, each one of the memory bit cells is a copied variation of a six-transistor RAM cell selected based on design needs. In other embodiments, other types of RAM cells may be used.

The row decoders and word line drivers in blocks 420A-420B receive address information corresponding to an access request. For example, each of the blocks 420A-420B receives the information provided by the access request address 470. Each one of the blocks 420A-420B selects a particular row, or entry, of the multiple rows in an associated one of the arrays 420A-420B. In some embodiments, the blocks 420A-420B use an index portion of the address 470 for selecting a given row, or entry, in an associated one of the arrays 420A-420B. Each row, or entry, stores one or more memory lines.

In the embodiment shown, the rows, or entries, in the arrays 420A-420B are arranged in a vertical orientation. However, in other embodiments, a horizontal orientation is used for storage of the memory lines. For write access requests, the write latches are located in block 450. The write data is driven into the arrays 410A-410B. The timing control logic 440a-440B sets up the write word line driver logic and updates the write latches with new data in block 450. The write data is written into a row of bit cells that is selected by an associated one of the blocks 420A-420B. In some embodiments, precharge circuitry is included in block 450.

For read access requests, the block 450 is used to precharge the read lines routed to the arrays 410A-410B. The timing logic in blocks 440A-440B is used for precharging and setting up the sense amplifiers in the blocks 430A-430B. The timing control logic 440A-440B sets up the read word line driver logic and a selected row selected by an associated one of the row decoders 420A-420B provides its data on the read lines, which are sensed by the sense amplifiers. The read latches capture the read data.

For each of the write access requests and read access requests, the selected row has certain bit cells selected for completion of the access request. In various embodiments, bit separation, which is also referred to as bit interleaving, is used to protect against soft errors. In some embodiments, the height of the bank 400 is sufficiently great as to interfere with the placement of other components on a die or a package along with interfering with the placement of reserved areas. Therefore, in some embodiments, the bank 400 is redesigned to use a sidecar array.

Figure 5:
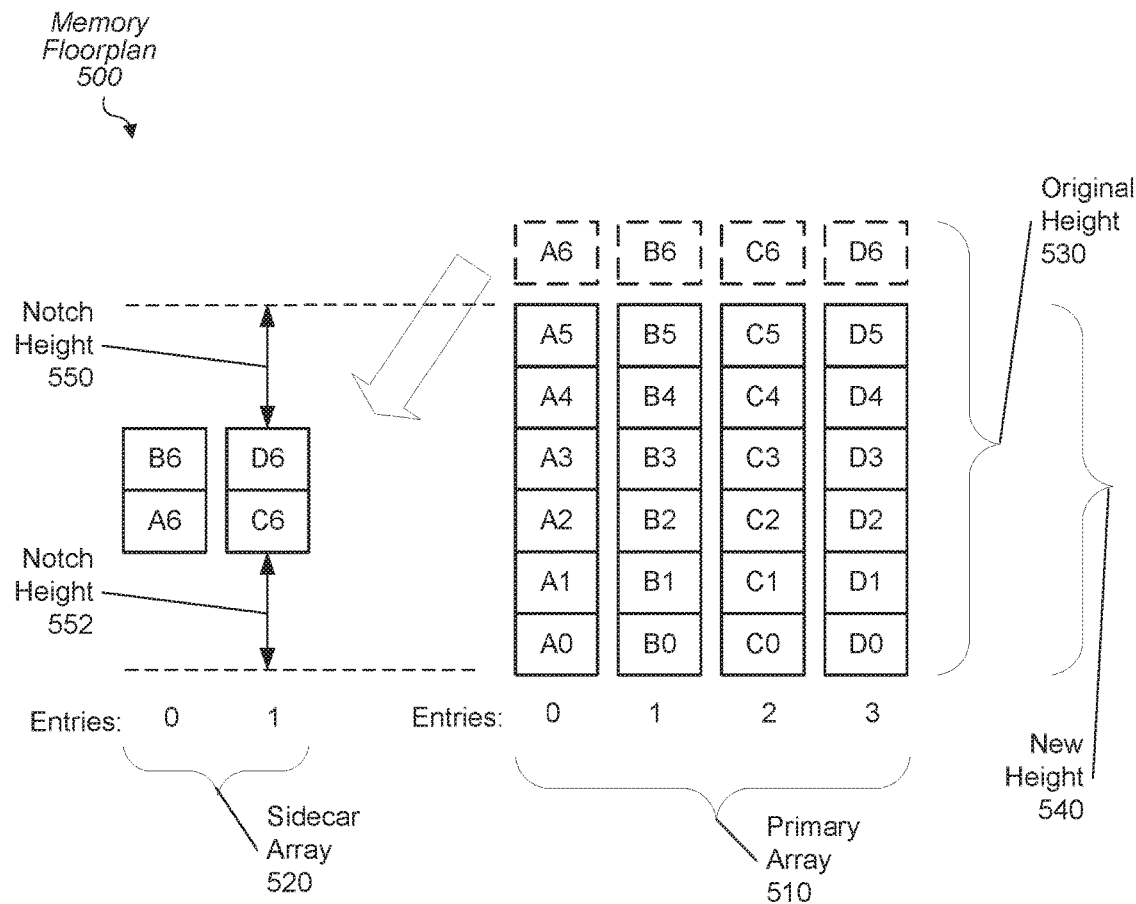
FIG. 5 is a generalized block diagram of another embodiment of a memory floorplan.

Turning now to FIG. 5, another embodiment of a memory floorplan 500 is shown. Generally speaking, the memory floorplan 500 includes a primary array 510 and a sidecar array 520. In this simplified example, the memory line includes a size of 7 bits. Therefore, a memory line includes 7 memory cells. The integer variable M indicating the number of bits in the memory line is 7. For example, one particular memory line includes memory cells A0 to A6, such as entry 0 in the primary array 510. In this example, 7 is the number of cells accessed as a unit for a memory access request. For example, in one embodiment, a memory access request for a particular memory line accesses cells A0 to A6. Another memory access request for a different memory line accesses cells C0 to C6, and so on. In various embodiments, the completion of the memory access request occurs in a same clock cycle or a same pipeline stage for the 7 cells of the particular memory line.

As shown, the primary array 510 actually stores 6 memory cells per entry, such as cells A0 to A5. The memory cell A6 is shown with a dashed border as this memory cell is moved to the separate sidecar array 520. Therefore, the integer variable A is 1, which indicates the number of bits of the memory line moved from the primary array 510 to the sidecar array 520. Accordingly (M−A) is (7−1), or 6. The primary array 510 stores 6 cells of the 7-cell memory line, whereas the sidecar array 520 stores 1 memory cell of the 7-cell memory line.

In this example, the reserved area being placed among the memory macro blocks in a memory has a height of 4 memory bit cells. In this example, the memory macro block will be a cross-shaped memory macro block and each notch in each corner has a height of 2 memory bit cells so that a notch at the top left has a height of 2 bit cells and a notch at the bottom left has a height of 2 bit cells for a total of 4 bit cells. The integer B indicates the total height of the reserved area used to define the notches. Therefore, B=4.

The heights are the same on the right side of the memory macro block. In various embodiments, the primary array 510 is placed on the right side of the memory macro block and the sidecar array 520 is placed on the left side of the memory macro block. Therefore, the sense amplifiers are able to sense the selected rows in each of the primary array 510 and the sidecar array 520 simultaneously. In other embodiments, the primary array 510 is placed on the left side of the memory macro block and the sidecar array 520 is placed on the right side of the memory macro block. In the example shown, the notch height 550 at the top is the same as the notch height 552 at the bottom. However, in other examples, the notch heights 550 and 552 are not the same as different reserved areas are above and below the memory macro block, each with different dimensions.

In the example shown, the primary array 510 has 4 entries or rows. The integer variable N is used to indicate this value, and thus, N is 4. In various embodiments, the sidecar array 520 has a number of entries equal to N/D, wherein D is an integer value that is the largest power-of-2 value that is also less than or equal to the ratio (M–A–B)/A. In the above example with the 7-bit memory line, the quotient is (7–1–4)/1, or 2. Therefore, the integer variable D is 2. The number of entries in the sidecar array is N/D or 4/2 or 2. The sidecar array 520 has 2 vertical entries, or 2 vertical rows.

As shown, entry 1 of the primary array 510 stores the 6 memory cells B0 to B5, whereas the 1 memory cell B6 is stored in the sidecar array 520. Similarly, entry 2 of the primary array 510 stores the 6 memory cells C0 to C5, whereas the 1 memory cell C6 is stored in the sidecar array 520. Entry 3 of the primary array 510 stores the 6 memory cells D0 to D5, whereas the 1 memory cells D6 is stored in the sidecar array 520.

Memories, such as RAM cells, latches and flip-flops, have storage reliability reduced by soft errors. Neutrons and other particles that collide with a node and cause an appreciable charge or discharge on the node inducing the soft errors. Reduced geometries used in silicon processing of circuitry and reduced supply voltages in semiconductor chips also contribute to soft errors. In some embodiments, the upset or affected node flips its value and loses its stored data.

Error detection and error correction logic and mechanisms are used to prevent data corruption. However, a single event, such as a neutron collision, is capable of upsetting two or more adjacent memory bit cells across rows or entries of a memory array. Therefore, multiple memory lines are affected and multiple bit cells within any particular memory line can be affected. The error correction mechanisms have a limit on a number of upset memory bit cells to be able to correct within a same particular memory line. For example, some error correction coding (ECC) techniques are able to detect up to two bit errors per memory line and correct one bit error per memory line.

In order to further protect data from soft errors, bits in a same memory line are spatially distanced from one another. Rather than increase the size of the memory array with unused space to protect against soft errors, the bits of multiple memory lines are interleaved. The bits in a same memory line are separated by a number of bit cells with the intermediate bit cells belonging to other memory lines. This technique is referred to as bit separation or bit interleaving. For example, a memory array requiring a 18 micron separation for soft errors with bit cells that have a 2 micron dimension utilizes a 9-bit interleave, or a 9-bit separation. Each bit of a memory line is separated by 8 bits, or 8 bit cells belonging to 8 other memory lines. Each bit, or bit cell, of the memory line has a separation of 18 microns center-to-center.

Returning to the above example, the primary array 510 has a 1-bit separation with no interleaved bit cells between the bits. For example, the bit cells A0 and A1 do not have any other bit cells between them. The variable S1 is used to indicate the bit separation in the primary array 510, and in this example, S1 is 1. The variable S2 is used to indicate the bit separation for the sidecar array 520. The bit separation S2 for the sidecar array 520 is S1 times D, or 1 times 2, which is 2. In this case, only a single bit is moved to the sidecar array 520. In other cases, a single bit cell of a first memory line would be interleaved between two bit cells from a different second memory line. As shown, though, in the current example, entry 0 of the sidecar array 520 stores the bit cells A6 and B6, whereas entry 1 stores the bit cells C6 and D6.

In various embodiments, the height of the sidecar array 520 is smaller than the height of the primary array 510, which is height 540. In some embodiments, the selection of the number of bits A to move from the primary array 510 to the sidecar array 520 depends on the pitch of reserved areas placed around memory macro blocks. As shown, the new height 540 used by the primary array 510 is less than the original height 530 of the memory array. Although the width of the memory array increased, the reduced height and the created notches aid floor planning of a chip by allowing reserved areas to be placed in the spaces created by the corner notches of the memory macro blocks. If the sidecar array 520 is placed in alignment with the top or the bottom of the primary array 510, then the resulting macro block would be a T-shaped macro block, rather than a cross-shaped macro block.

In this example, 2 index bits of a received address are used by row decoders to select one of the four entries 0-3 (e.g., 00, 01, 10 and 11) in the primary array 510. As shown earlier in FIG. 4, row decoders 420A-420B are used to access memory lines within arrays 410A-410B. As shown in FIG. 5, the 2-entry sidecar array 520 stores the remaining bit for each of the four 7-bit memory lines. The most significant index bit of these same 2 index bits is used by row decoders for selecting an entry in the sidecar array 520 (e.g., 0 and 1). Therefore, to access the memory line C, which includes bits C0-C6, the 2 index bits of the same address in the received access request with the binary value 10 accesses entry 2 in the primary array 510. The most significant bit of the 2-bit index 10 is used to access entry 1 in the sidecar array 520. Entry 2 in the primary array 510 stores bits C0-C5 and it is accessed by the 2-bit index 10, and entry 1 in the sidecar bank stores C6 and it is accessed with the most significant bit of the 2-bit index 10. Each of the primary array 510 and the sidecar array 520 would be accessed using a same address in a similar manner as caches are generally accessed. The selection of which index bits to use within the same address would differ within the respective row decoders and word line drivers.

Figure 6:
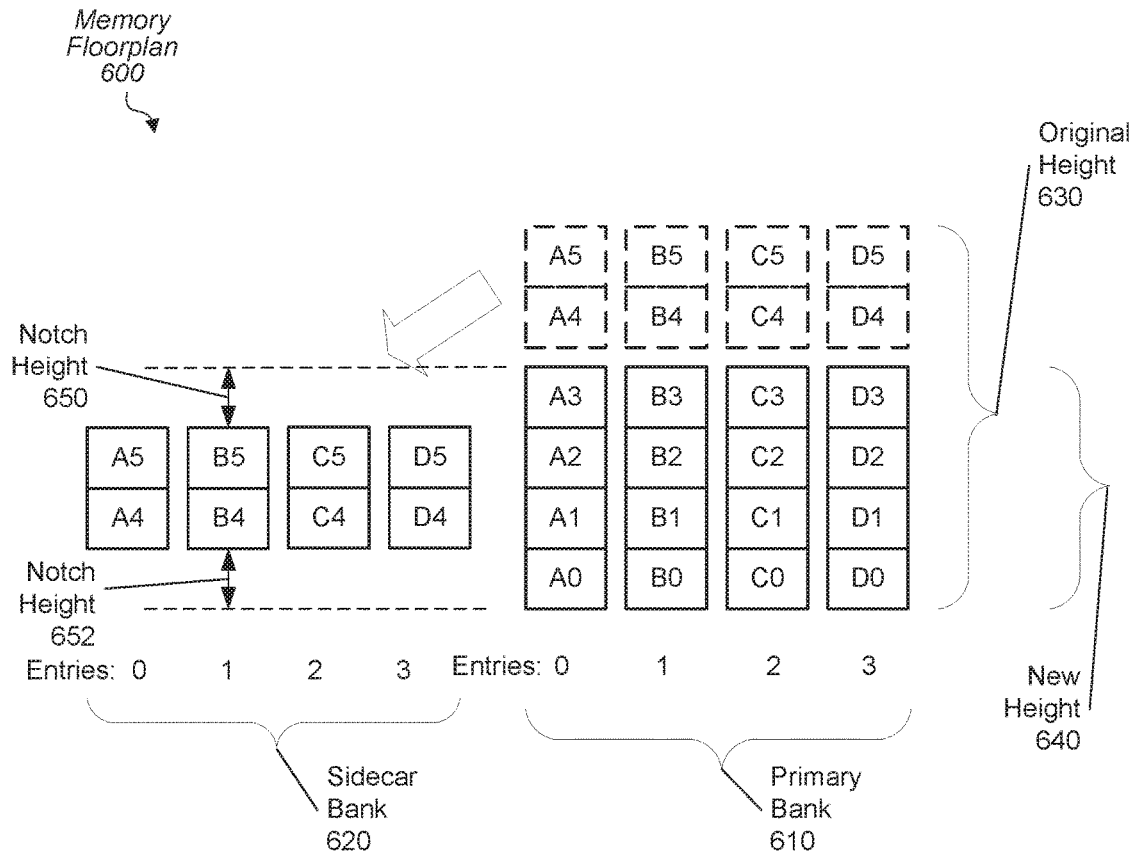
FIG. 6 is a generalized block diagram of another embodiment of a memory floorplan.

Turning now to FIG. 6, another embodiment of a memory floorplan 600 is shown. The memory floorplan 600 includes a primary array 610 and a sidecar array 620. In this simplified example, the memory line includes a size of 6 bits. Therefore, a memory line includes 6 memory cells. The integer variable M indicating the number of bits in the memory line is 6. One memory line stores memory cells A0 to A5, a second memory line stores memory cells B0 to B5, and so on.

As shown, the primary array 610 actually stores 4 memory cells per entry, such as cells A0 to A3 in entry 0. The memory cells A4 and A5 are shown with a dashed border as these memory cells are moved to the separate sidecar array 620. Therefore, the integer variable A is 2, which indicates the number of bits of the memory line moved from the primary array 610 to the sidecar array 620. Accordingly (M–A) is (6–2), or 4. The primary array 610 stores 4 cells of the 6-cell memory line, whereas the sidecar array 620 stores 2 memory cells of the 6-cell memory line.

In this example, the reserved area being placed among the memory macro blocks in a memory has a height of 2 memory bit cells. In this example, the memory macro block will be a cross-shaped memory macro block and each notch in each corner has a height of 1 memory bit cell so that the notch height 650 at the top left has a height of 1 bit cell and a notch height 652 at the bottom left has a height of 1 bit cell for a total of 2 bit cells. The integer B indicates the total height of the reserved area used to define the notches. Therefore, B=2. As described earlier, in some embodiments, the notch heights 650 and 652 are not the same as different reserved areas are above and below the memory macro block, each with different dimensions.

In the example shown, the quotient (M−A−B)/A is (6−2−2)/2, or 1. The integer D is the largest power-of-2 value that is also less than or equal to the quotient, so D is 1. The primary array 610 has 4 entries, so N is 4, and the sidecar array 620 has N/D entries, or 4/1=4 entries. Therefore, in this example, each of the primary array 610 and the sidecar array 620 has 4 vertically oriented entries. The primary array 610 has a 1-bit separation with no interleaved bit cells between the bits, so the variable S1 is 1. The variable S2 indicates the bit separation for the sidecar array 620, which is S1 times D, or 1 times 1, which is 1. In this case, the sidecar array 620 also has no interleaved bit cells between the bits. As shown, entry 0 of the sidecar array 520 stores the bit cells A4 and A5, whereas entry 1 stores the bit cells B4 and B5, and so on.

In various embodiments, the height of the sidecar array 620 is smaller than the height of the primary array 610, which is height 640. The new height 640 used by the primary array 610 is less than the original height 630 of the memory array. Although the width of the memory array increased, the reduced height and the created notches aid floor planning of a chip by allowing reserved areas to be placed in the spaces created by the corner notches of the memory macro blocks. If the sidecar array 620 is placed in alignment with the top or the bottom of the primary array 610, then the resulting macro block would be a T-shaped macro block, rather than a cross-shaped macro block. The selection of the entries within the primary array 610 and the sidecar array 620 using index bits within a same address for an access request is done in a similar manner as described earlier for the access of the primary array 510 and the sidecar array 520 in FIG. 5.

Figure 7:
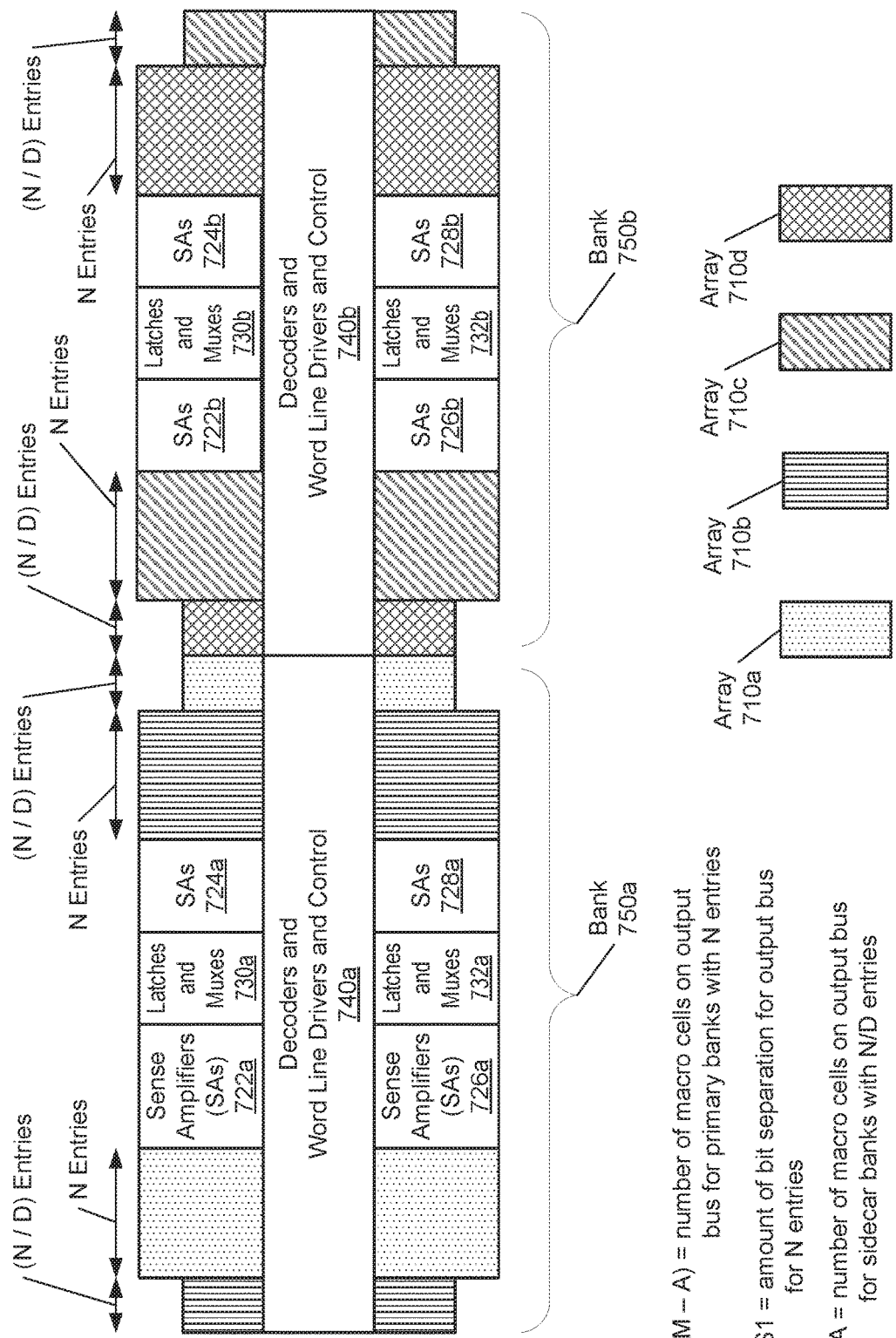
FIG. 7 is a generalized block diagram of another embodiment of a memory floorplan.

Turning now to FIG. 7, a generalized block diagram of another embodiment of an efficient memory floorplan 700 is shown. As shown, the bank 750*a* includes the arrays 710*a*-710*b* and the bank 750*b* includes the arrays 710*c*-710*d*. Each of the banks 750*a*-750*b* is partitioned into primary arrays with N entries and sidecar arrays with N/D entries. Similar to earlier examples, as one or more sidecar arrays provide on-die space such as the notches, the sidecar arrays are considered to have irregular sized entries compared to the primary arrays.

In some embodiments, each of the banks 750*a*-750*b* is used as a cross-shaped memory macro block. As shown, the array 710*a* has a primary array with N entries located in the bank 750*a* where the primary array is divided into a top half and a bottom half. The array 710*a* also has a sidecar array with (N/D) entries located in the bank 750*a* where the sidecar array is divided into a top half and a bottom half.

Using an example with a 74-bit memory line and 14 bits are moved to sidecar arrays, the bank 750*a* includes 2 primary arrays, one for each of the arrays 710*a* and 710*b*.

Each of these primary arrays includes 64 entries. Each of these primary arrays includes (M−A), or (74−14), or 60 bits of the 74-bit memory line. The top halves of the primary arrays include 30 bits. Similarly, the bottom halves of the primary arrays include 30 bits.

In addition, the bank 750*a* includes 2 sidecar arrays, one for each of the arrays 710*a* and 710*b*. Each notch in each corner has a height of 6 memory bit cells so that a notch at the top left has a height of 6 bit cells and a notch at the bottom left has a height of 6 bit cells for a total of 12 bit cells. Therefore, the quotient (M−A−B)/A provides the result (74−16−12)/16=2.88. The largest power-of-2 value less than or equal to 2.88 is the integer 2. Each of the sidecar arrays include (N/D), or (64/2), or 32 entries. Each of the sidecar arrays includes 14 bits in this example. The entries in the top halves of the sidecar arrays include 7 bits of a respective memory line. Similarly, the entries in the bottom halves of the sidecar arrays include 7 bits of a respective memory line. The shared sense amplifiers 722*a* read from a bit line shared by the primary array and unassociated sidecar array in the top left half of the bank 750*a*. Similarly, the shared sense amplifiers 726*a* charges a bit line shared by the primary array and unassociated sidecar array in the bottom left half of the bank 750*a*. The shared sense amplifiers 724*a* charge a bit line shared by the primary array and unassociated sidecar array in the top right half of the bank 750*a*. The shared sense amplifiers 728*a* charge a bit line shared by the primary array and unassociated sidecar array in the bottom right half of the bank 750*a*. The shared sense amplifiers 722*b*, 724*b*, 726*b* and 728*b* perform similar charging and sensing operations for the bank 750*b* as the operations described for the bank 750*a*.

Continuing with the above example, each of the primary arrays in the memory 700 has an 8-bit separation. Each of the sidecar arrays has a bit separation of (S1×D), or (8×2), or 16. When a request is received to access a 74-bit memory line corresponding to the array 710*a*, 60 bits of the memory line are accessed in the corresponding primary array in the bank 750*a*. Additionally, 14 bits of the memory line are accessed in the corresponding sidecar array in the bank 750*b*. Since bit lines are read by a shared sense amplifier and the bit lines are shared by the primary arrays and the unassociated sidecar arrays, the read muxes in the blocks 730*a*, 732*a*, 730*b* and 732*b* select between information stored in primary arrays and information stored in the sidecar arrays.

The read muxes in a respective one of the blocks 730*a*, 732*a*, 730*b* and 732*b* select between the one of the A bits in a sidecar array and a set of D bits of the (M−A−B) bits in an unassociated primary array. Therefore, a read line to be sensed by a sense amplifier is routed to a first bit position of each entry in the primary array and to a second bit position of each entry in the unassociated sidecar array, and the second bit position is different from the first bit position. In addition, each of the A bits in the sidecar array is routed to selection logic and a set of D bits of the (M−A) bits in an unassociated primary array is also routed to the selection logic. In various embodiments, the selection logic is a multi-input multiplexer.

For example, when D is found to be 2, a read mux selects between bits 59 and 58 in the primary array and bit 73 in the unassociated sidecar array. Should the value D be 4, such as in a different example, the read mux selects between bits 59 to 56 in the primary array and bit 73 in the unassociated sidecar array. Here, the read mux selected between the most-significant 4 bits of the 60 bits in the primary array and the most-significant single bit in the 14-bit unassociated sidecar array. In addition, the completion of the access request for all M, or 74, bits of the memory line is done at a similar time, such as a same clock cycle. The completion of the access request is not staggered for the primary array and the sidecar array.

In a similar manner, the bank 750b has primary arrays for arrays 710c and 710d and sidecar arrays for arrays 710c and 710d. The accesses and arrangements are similar to those used in the bank 750a. In various embodiments, reserved areas are placed in the spaces created by the corner notches of the cross-shaped banks 750a-750b. No wide channels are used as they are unnecessary. Previous empty spaces due to wide channels are filled by additional memory cells, thus increasing area efficiency and reducing die and/or package size.

In yet other embodiments, a memory line is partitioned between an entry in a primary array of a first macro block and an entry in a sidecar array of a second, different macro block. During a read operation, the entire memory line would be reconstructed from the two macro blocks. Therefore, both sidecar arrays in the left bank and the right bank of a same macro block are unassociated with either of the two primary arrays in the same macro block. In such embodiments, the sense amplifier is not relied upon to sense both the left bank and the right bank during memory line accesses.

Figure 8:
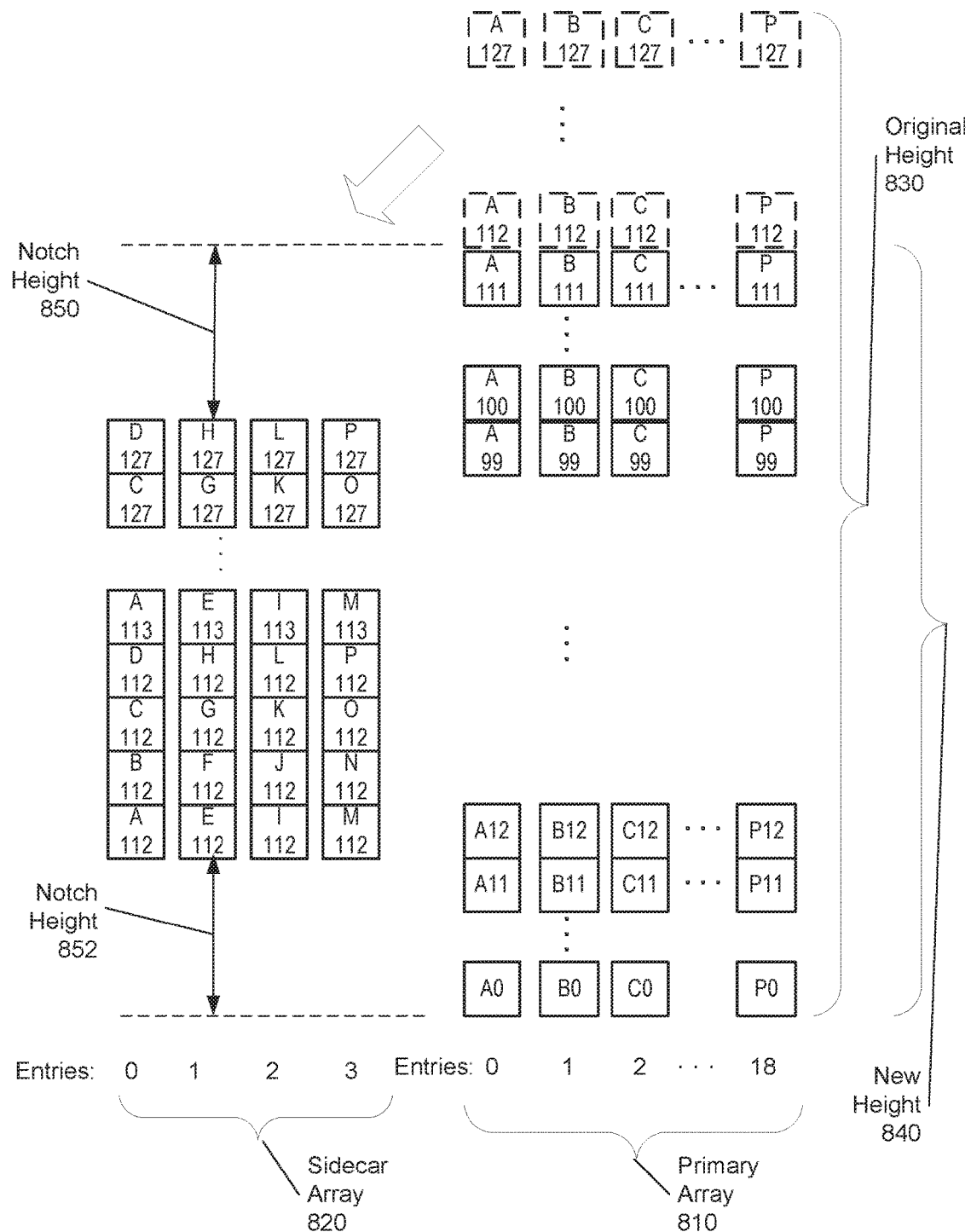
FIG. 8 is a generalized block diagram of another embodiment of a memory floorplan.

Turning now to FIGS. 8 and 9, another embodiment of a memory floorplan 800 is shown. The memory floorplan 800 includes a primary array 810 and a sidecar array 820. In this example, the memory line includes a size of 128 bits. Therefore, a memory line includes 128 memory cells. The integer variable M indicating the number of bits in the memory line is 128. One memory line stores memory cells A0 to A127, a second memory line stores memory cells B0 to B127, and so on.

As shown, the primary array 810 actually stores 112 memory cells per entry, such as cells A0 to A111 in entry 0. The memory cells A112 to A127 are shown with a dashed border as these memory cells are moved to the separate sidecar array 820. Therefore, the integer variable A is 16, which indicates the number of bits of the memory line moved from the primary array 810 to the sidecar array 820. FIG. 9 shows the variable M is 128 and the variable A is 16, and additionally (M-A) is (128-16), or 112. The primary array 810 stores 112 cells of the 128-cell memory line, whereas the sidecar array 820 stores 16 memory cells of the 128-cell memory line.

In this example, the reserved area being placed among the memory macro blocks in a memory has a height of 24 memory bit cells. In this example, the memory macro block will be a cross-shaped memory macro block and each notch in each corner has a height of 12 memory bit cells so that the notch height 850 at the top left has a height of 12 bit cells and a notch height 852 at the bottom left has a height of 12 bit cells for a total of 24 bit cells. Therefore, the integer B=24. As described earlier, in some embodiments, the notch heights 850 and 852 are not the same as different reserved areas are above and below the memory macro block, each with different dimensions.

In the example shown, the quotient shown in FIG. 9 is (M-A-B)/A is (128-16-24)/16, or 5.50. The integer D is the largest power-of-2 value that is also less than or equal to the quotient, so D is 4. The primary array 810 has 16 entries, so N is 16, and the sidecar array 820 has N/D entries, or 16/4=4 entries. Therefore, in this example, the primary array 810 has 16 vertically oriented entries and the sidecar array 820 has 4 vertically oriented entries.

As shown, the primary array 810 has a 1-bit separation with no interleaved bit cells between the bits, so the variable S1 is 1. The variable S2 indicates the bit separation for the sidecar array 820, which is S1 times D, or 1 times 4, which is 4. In this case, the entries in the sidecar array 820 have interleaved bit cells between the bits of a same memory line. As shown, entry 0 of the sidecar array 520 stores the bit cells B112 to D112 between the bit cells A112 and A113 of the same memory line. The other entries store bit cells in a similar manner with the same amount of interleaving.

In various embodiments, the height of the sidecar array 820 is smaller than the height of the primary array 810, which is height 840. The new height 840 used by the primary array 810 is less than the original height 830 of the memory array. Although the width of the memory array increased, the reduced height and the created notches aid floor planning of a chip by allowing reserved areas to be placed in the spaces created by the corner notches of the memory macro blocks. If the sidecar array 820 is placed in alignment with the top or the bottom of the primary array 810, then the resulting macro block would be a T-shaped macro block, rather than a cross-shaped macro block. The selection of the entries within the primary array 810 and the sidecar array 820 is done in a similar manner as described earlier for the access of the primary array 510 and the sidecar array 520 in FIG. 5.

Figure 10:
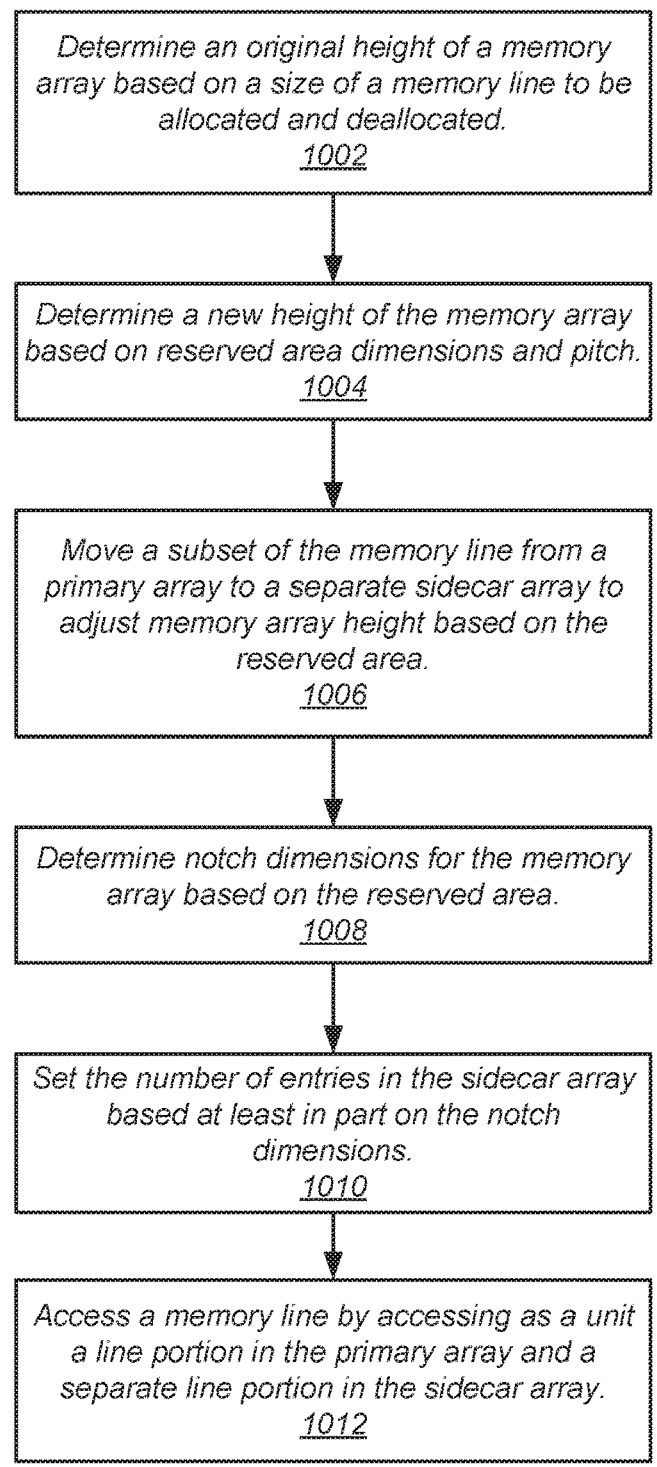
FIG. 10 is a generalized flow diagram of one embodiment of a method for efficiently floor planning a memory.

Referring now to FIG. 10, a generalized flow diagram of one embodiment of a method 1000 for efficiently floor planning memory is illustrated. For purposes of discussion, the steps in this embodiment (as well as in FIG. 11) are shown in sequential order. However, in other embodiments some steps occur in a different order than shown, some steps are performed concurrently, some steps are combined with other steps, and some steps are absent. In various embodiments, the method described in FIG. 10 and FIG. 11 may be performed by a computing system. For example, in some embodiments the computing system comprising a design tool (e.g., hardware and/or software) configured to perform the methods described below in order to generate a floor plan for one or more memories. In other embodiments, the computing system may comprise a fabrication tool configured to perform the method(s) in order to fabricate one or more memories or cause one or more other fabrication tools to fabricate one or more memories.

In block 1002, an original height of a memory array is determined based on a size of a memory line to be allocated and deallocated in addition to a pitch of one or more reserved areas. The size of the memory line includes a number of bits or bit cells in the memory line. In various embodiments, both metadata and a data word size are used to determine the size of the memory line. In some embodiments, the original height for the memory array is a height of a memory bit cell times the bit separation for the memory array. For example, a memory with a 2-micron bit cell height, a 74-bit memory line and an 8-bit separation, the original height is 1,184 microns.

In addition, the height is based on the number of entries or rows in the memory. Software simulations of benchmarks and circuit constraints are used to set the number of entries. In one example, the memory has 128 rows or entries partitioned into 2 banks, such as a left bank and a right bank. Each bank has 64 rows or entries. In block 1004, a new height of the memory array is determined based on the dimensions and the pitch of reserved areas. As described earlier, the reserved areas are on-die areas used for the placement of repeaters for routing and buffering clock signals as well as data and control signals across the die or package. The reserved areas can also include areas used for placement of through silicon vias (TSVs) and their corresponding keep out zones.

In block 1006, a subset of the memory line from a primary array is moved to a separate sidecar array to adjust memory array height based on the reserved area. Using the above example, selecting 14 bits to move to a sidecar array causes the new height of the memory array to be 2 microns per bit times (74−14) bits times 8-bit separation, or 960 microns. The height of the memory array is reduced from 1,184 microns to 960 microns.

Notch dimensions are determined for the memory array based on the reserved area (block 1008). In some embodiments, a cross-shaped memory macro block is used with notches in each of the four corners of the macro block. In other embodiments, a T-shaped memory macro block is used with notches in each of the top two corners or in each of the bottom two corners of the macro block. In yet other embodiments, an L-shaped memory macro block is used with a single notch in one of the corners of the macro block. For L-shaped memory macro blocks, the sidecar array with no notch uses a number of entries and a bit separation based on the value B being 0, whereas the sidecar array with a notch uses a number of entries and a bit separation based on a non-zero value B. The notch dimensions are based on the amount of the reserved area to be placed within the notch.

The number of entries in the sidecar array is set based at least in part on the notch dimensions (block 1010). As described in earlier examples, the variable B indicates the dimension along the row or entry of the sidecar array that allows a reserved area to be placed in the notch. In some embodiments, the variable B is measured as a number of memory bit cells. As shown in earlier examples, the variable B is used in the quotient (M−A−B)/A, and the variable D is the largest power-of-2 value less than or equal to the quotient and the number of entries in the sidecar array is the number of entries in the primary array divided by D.

In block 1012, the (M−A) bits in the primary array of the memory array and the A bits in the separate sidecar array are accessed as a unit. For example, a read, a write, an update or other memory access request completes for a particular M-bit memory line by completing access of the (M−A) bits in the primary array and the A bits in the sidecar array as a unit. In some embodiments, the access of the primary array and the sidecar array as a unit is performed in a same clock cycle or same pipeline stage. The selection of the entries within the primary array and the sidecar array using index bits within a same address for an access request is done in a similar manner as described earlier for the access of the primary array 510 and the sidecar array 520 in FIG. 5.

For the received access request, control logic accesses a first entry of multiple entries in the primary array and a second entry of multiple entries in the sidecar array using a same address in the received access request. The control logic completes the access request in a predetermined portion of the first entry of the primary array. In various embodiments, the predetermined portion of the first entry includes (M−A) bits corresponding to the address in the received access request. As an example, the control logic completes the access request in a 60-bit portion of the first entry. In various embodiments, the first entry includes more bits than the (M−A) bits corresponding to the address in the received access request. As an example, the first entry includes 480 bits, which is greater than the 60-bit portion corresponding to the address in the received access request. Similarly, the control logic completes the access request in a predetermined portion of the second entry of the sidecar array. In various embodiments, the predetermined portion of the second entry includes A bits corresponding to the address in the received access request. In various embodiments, the second entry includes more bits than the A bits corresponding to the address in the received access request. As described earlier, the completion of the access request is not staggered for the primary array and the sidecar array.

Figure 11:
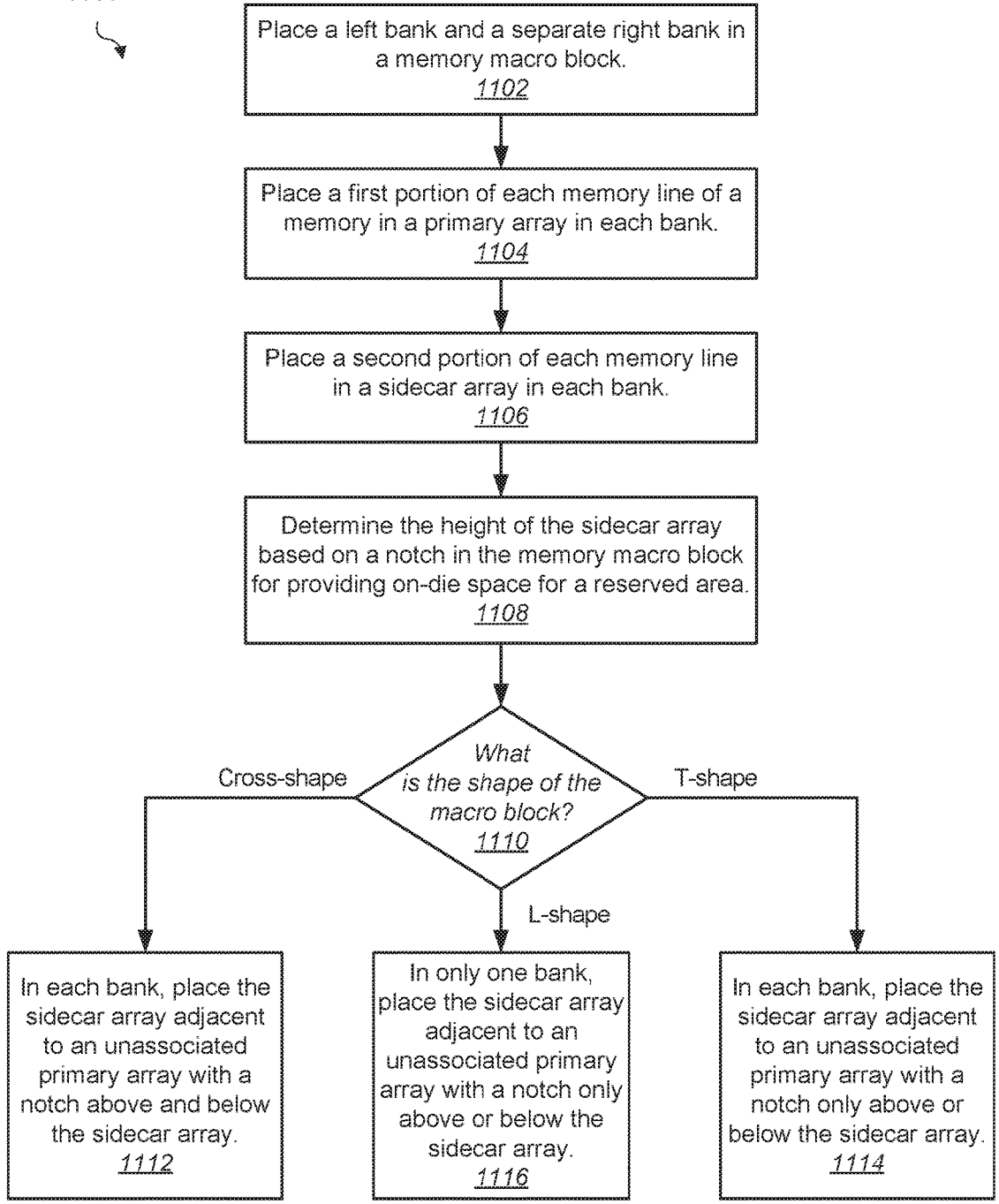
FIG. 11 is a generalized flow diagram of another embodiment of a method for efficiently floor planning a memory.

Referring now to FIG. 11, a generalized flow diagram of another embodiment of a method 1100 for efficiently floor planning memory is illustrated. When creating a memory macro block to be instantiated multiple times in a memory, each of a left bank and a separate right bank are placed in the memory macro block (block 1102). The left bank and the right bank are separated from one another. The left bank includes a primary array and the right bank includes an associated sidecar array. Similarly, right bank includes a primary array and the left bank includes an associated sidecar array. In each of the left bank and the right bank, a first portion of each memory line of the memory is placed in the respective primary array (block 1104). As described earlier, software simulations of benchmarks and circuit constraints are used to set the number of entries in the primary arrays.

In each of the left bank and the right bank, a second portion of each memory line is placed in the respective sidecar array (block 1106). The second portion in the sidecar array is smaller than a corresponding first portion in the primary array in the other bank. The height of the sidecar array is determined based on a notch in the memory macro block for providing on-die space for a reserved area (block 1108).

Multiple shapes are possible for implementing the memory macro block. If the memory macro block is selected to be a cross-shaped macro block (conditional block 1110, "Cross-shape" leg), then in each bank, the sidecar array is placed adjacent to an unassociated primary array with a notch above and below the sidecar array (block 1112). If the memory macro block is selected to be a T-shaped macro block (conditional block 1110, "T-shape" leg), then in each bank, the sidecar array is placed adjacent to an unassociated primary array with a notch only above or below the sidecar array (block 1114).

If the memory macro block is selected to be an L-shaped macro block (conditional block 1110, "L-shape" leg), then in only one bank, the sidecar array is placed adjacent to an unassociated primary array with a notch only above or below the sidecar array. As described earlier, For L-shaped memory macro blocks, the sidecar array (e.g., left bank) with no notch uses a number of entries and a bit separation based on the value B being 0, whereas the sidecar array (e.g., right bank) with a notch uses a number of entries and a bit separation based on a non-zero value B. The notch dimensions are based on the amount of the reserved area to be placed within the notch. In some embodiments, the sidecar array with no notch is in the left bank, but in other embodiments, the sidecar array with no notch is in the right bank.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of designing a memory, the method comprising:
   generating layout data describing the memory, said generating comprising:
      placing, by the computing system, a first portion of each memory line of the memory in a primary array of a memory macro block;
      placing, by the computing system, a second portion of each memory line in a sidecar array of the memory macro block, wherein the second portion is smaller than the first portion;
      determining, by the computing system, a height of the sidecar array based on a notch in the memory macro block corresponding to a reserved area, wherein the height of the sidecar array is less than a height of the primary array;
      placing, by the computing system, the sidecar array in the memory macro block such that the notch is above or below the sidecar array when bit lines are oriented horizontally;
   generating on one or more integrated circuit masks a description of the layout data.

2. The method as recited in claim 1, wherein the reserved area is used for placement of one or more of a group of signal buffers, control logic, and a through silicon via with a corresponding keep out zone.

3. The method as recited in claim 1, wherein each memory line in the memory comprises M bits, the second portion in the sidecar array comprises A bits of the M bits, a height of the reserved area comprises B bits, and the sidecar array has a number of entries equal to a number of entries in the primary array divided by an integer D, where D is a largest power-of-2 value less than or equal to a ratio of $(M-A-B)/A$.

4. The method as recited in claim 3, further comprising:
   placing the first portion of each memory line in the primary array with a bit separation S1; and
   placing the second portion of each memory line in the sidecar array with a bit separation S2 equal to D times S1.

5. The method as recited in claim 4, wherein the memory macro block further comprises a left bank and a right bank separated from one another, wherein the left bank includes a primary array and the right bank includes a sidecar array associated with the primary array in the left bank, and the right bank includes a primary array and the left bank includes a sidecar array associated with the primary array in the right bank.

6. The method as recited in claim 5, wherein for at least one of the left bank and the right bank, the method further comprises routing a read line to be sensed by a sense amplifier to a first bit position of each first portion in the primary array and to a second bit position of each second portion in an unassociated sidecar array, wherein the second bit position is different from the first bit position.

7. The method as recited in claim 6, wherein for at least one of the left bank and the right bank, the method further comprises routing each of the A bits in a sidecar array to selection logic and routing a set of D bits of the (M−A) bits in an unassociated primary array to the selection logic.

8. The method as recited in claim 5, further comprising instantiating multiple copies of the memory macro block adjacent to one another, wherein at least one corner of each of the plurality of macro blocks comprises a notch providing on-die space for a reserved area.

9. The method as recited in claim 5, wherein when creating a cross-shaped memory macro block, the method further comprises placing in each of the left bank and the right bank a sidecar array adjacent to an unassociated primary array with a notch above and below the sidecar array.

10. The method as recited in claim 5, wherein the computing system comprises one of a design tool and a fabrication tool.

11. The method as recited in claim 1, wherein a first bit line in the primary array and a second bit line in the sidecar array are a shared bit line for an access request, wherein the first bit line has a different number of bit lines above it than a number of bit lines above the second bit line and the first bit line has a different number of bit lines below it than a number of bit lines below the second bit line.

12. A system for generating on one or more masks a layout of an integrated circuit, the system comprising:
   a processor; and
   a non-transitory computer readable medium storing instructions, the instructions when executed by the processor causing the system to:
      generate layout data describing the integrated circuit, wherein to generate said layout the system is configured to:

place a first portion of each memory line of a memory in a primary array of a memory macro block;

place a second portion of each memory line in a sidecar array of the memory macro block, wherein the second portion is smaller than the first portion;

determine a height of the sidecar array based on a notch in the memory macro block corresponding to a reserved area, wherein the height of the sidecar array is less than a height of the primary array;

place the sidecar array in the memory macro block such that the notch is above or below the sidecar array when bit lines are oriented horizontally;

generate on one or more integrated circuit masks a description of the layout data.

13. The system as recited in claim 12, wherein each memory line in the memory comprises M bits, the second portion in the sidecar array comprises A bits of the M bits, a height of the reserved area comprises B bits, and the sidecar array has a number of entries equal to a number of entries in the primary array divided by an integer D, where D is a largest power-of-2 value less than or equal to a ratio of (M−A−B)/A.

14. The system as recited in claim 12, wherein the program instructions are further executable to:

place the first portion of each memory line in the primary array with a bit separation S1; and place the second portion of each memory line in the sidecar array with a bit separation S2 equal to D times S1.

15. The system as recited in claim 14, wherein the memory macro block further comprises a left bank and a right bank separated from one another, wherein the left bank includes a primary array and the right bank includes an associated sidecar array.

16. The system as recited in claim 15, wherein for at least one of the left bank and the right bank, the program instructions are further executable to route a read line to be sensed by a sense amplifier to a first bit position of each first portion in the primary array and to a second bit position of each second portion in the unassociated sidecar array, wherein the second bit position is different from the first bit position.

17. A computing system comprising:

a processing unit;

a memory comprising at least one memory macro block, wherein the at least one memory macro block comprises:

a primary array storing a first portion of each memory line of the memory;

a sidecar array storing a second portion of each memory line of the memory, wherein the second portion is smaller than the first portion;

wherein a height of the sidecar array is based on a notch in the memory macro block corresponding to a reserved area, wherein the height of the sidecar array is less than a height of the primary array; and wherein the sidecar array is placed in the memory macro block such that the notch is above or below the sidecar array when bit lines are oriented horizontally; and control logic, wherein in response to receiving an access request corresponding to a first memory line from the processing unit, the control logic is configured to access both a first entry of a first plurality of entries in the primary array and a second entry of a second plurality of entries in the sidecar array based on a same address in the received access request.

18. The computing system as recited in claim 17, wherein each memory line in the memory comprises M bits, the second portion in the sidecar array comprises A bits of the M bits, a height of the reserved area comprises B bits, and the sidecar array has a number of entries equal to a number of entries in the primary array divided by an integer D, where D is a largest power-of-2 value less than or equal to a ratio of (M−A−B)/A.

19. The computing system as recited in claim 18, wherein the primary array has a bit separation S1 and the sidecar array has a bit separation S2 equal to D times S1.

20. The computing system as recited in claim 18, wherein the memory comprises a plurality of macro blocks, and wherein each of four corners of each of the plurality of memory macro blocks comprises a notch providing on-die space for the reserved area.

\* \* \* \* \*